United States Patent
Pyzik et al.

[11] Patent Number: 5,820,965
[45] Date of Patent: Oct. 13, 1998

[54] COMPUTER DISK SUBSTRATE, THE PROCESS FOR MAKING SAME, AND THE MATERIAL MADE THEREOF

[75] Inventors: Aleksander J. Pyzik; Chan Han; Uday V. Deshmukh; Kevin J. Nilsen; Donald J. Perettie; Arthur R. Prunier, Jr., all of Midland, Mich.

[73] Assignee: The Dow Chemical Company, Midland, Mich.

[21] Appl. No.: 868,217

[22] Filed: Jun. 3, 1997

Related U.S. Application Data

[60] Division of Ser. No. 496,798, Jun. 29, 1995, abandoned, which is a continuation-in-part of Ser. No. 354,185, Dec. 12, 1994, abandoned.

[51] Int. Cl.$^6$ ............................. B32B 3/10; B32B 5/02; C04B 35/503

[52] U.S. Cl. .................... 428/65.6; 428/64.2; 428/320.2; 428/328; 428/539.5; 428/694 T; 428/698; 501/87; 501/96.3

[58] Field of Search .......................... 428/539.5, 320.2, 428/325, 328, 689, 694 T, 698, 699, 704, 64.2, 65.3, 65.5, 65.6; 501/87, 88, 89, 90, 91, 92, 93, 96.1, 97.1

[56] References Cited

U.S. PATENT DOCUMENTS

| | | | |
|---|---|---|---|
| 4,598,017 | 7/1986 | Bayer et al. | 428/336 |
| 4,605,440 | 8/1986 | Halverson et al. | 75/238 |
| 4,623,388 | 11/1986 | Jatkar et al. | 75/232 |
| 4,702,770 | 10/1987 | Pyzik et al. | 75/236 |
| 4,718,941 | 1/1988 | Halverson et al. | 75/236 |
| 4,834,938 | 5/1989 | Pyzik et al. | 419/6 |
| 4,885,130 | 12/1989 | Claar et al. | 419/12 |
| 4,946,500 | 8/1990 | Zedalis et al. | 75/232 |
| 4,949,194 | 8/1990 | MacPherson et al. | 360/104 |
| 4,988,645 | 1/1991 | Holt et al. | 501/91 |
| 5,039,633 | 8/1991 | Pyzik et al. | 501/93 |
| 5,045,278 | 9/1991 | Das et al. | 419/16 |
| 5,273,834 | 12/1993 | Hoover et al. | 428/694 |
| 5,296,417 | 3/1994 | Claar et al. | 501/87 |
| 5,298,468 | 3/1994 | Pyzik | 501/87 |
| 5,308,422 | 5/1994 | Askay et al. | 156/89.28 |
| 5,480,695 | 1/1996 | Tenhover et al. | 428/65.5 |
| 5,486,223 | 1/1996 | Carden | 75/244 |
| 5,487,931 | 1/1996 | Annacone et al. | 428/64.1 |
| 5,552,204 | 9/1996 | Ahlert et al. | 428/65.5 |
| 5,614,308 | 3/1997 | Claar | 428/312.6 |
| 5,626,943 | 5/1997 | Tenhover | 428/141 |
| 5,633,213 | 5/1997 | Aghajanian et al. | 501/87 |
| 5,648,303 | 7/1997 | Nakamura | 501/87 |
| 5,670,253 | 9/1997 | Chiu et al. | 428/336 |
| 5,712,014 | 1/1998 | Carden | 428/65.6 |

FOREIGN PATENT DOCUMENTS

| | | |
|---|---|---|
| 0322336 | 5/1993 | European Pat. Off. . |
| 0299905 | 6/1993 | European Pat. Off. . |
| 0378504 | 8/1994 | European Pat. Off. . |

*Primary Examiner*—Karl Group
*Attorney, Agent, or Firm*—Kevin J. Nilsen; Timothy S. Stevens; Norman L. Sims & Jill U. Blasy

[57] ABSTRACT

A hard drive disk substrate is formed of a multi-phase ceramic-based material having at least two phases with amorphous phases being present in an amount less than about 1 volume percent based on the volume of the ceramic-based material or at least one phase being free metal. A process for producing the ceramic-based disk substrate is produced by forming a flat disk of a porous ceramic and then infiltrating the porous ceramic with a metal whereby a multi-phase ceramic-based computer hard drive disk is produced. Additionally, a step of passivating the porous ceramic by elevating it to a temperature of about 1300° to about 1800° C. before the infiltrating step may be performed, such that the surfaces are passivated and the reaction kinetics can be controlled during the infiltrating step. A preferred composite material is made of a multi-phase boron carbide composite material including grains having peaks with an average roughness value, Ra, of between about 1 to about 200Å, the roughness value being formed in situ by causing a micro hardness gradient of between about 19 and about 3200 Kg/mm$^2$ in the various phases of the multi-phase boron carbide composite material.

22 Claims, 3 Drawing Sheets

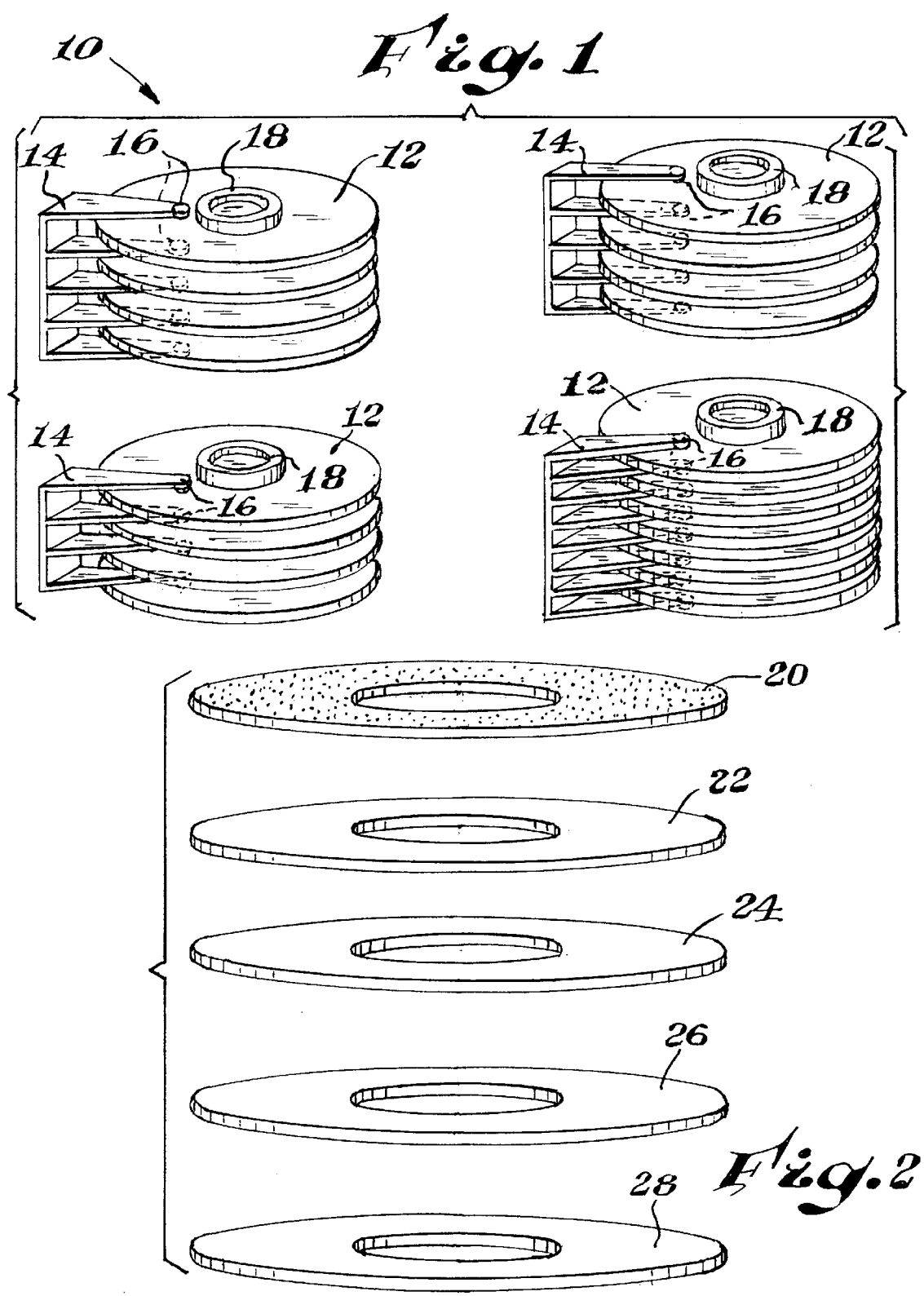

FIG. 3

| | | Al | Al$_2$O$_3$ | SiC | CANASITE (GLASS-CERAMIC) | Al-B-C CERAMIC |
|---|---|---|---|---|---|---|
| DENSITY | ↓ | 2.7 | 4.0 | 3.2 | 2.7 | <3 |
| ELASTIC MODULUS GPa | ↑ | 68 | 380 | 400 | 83 | 220-380 |
| SPECIFIC MODULUS | ↑ | 25 | 95 | 125 | 31 | 80-135 |
| ELECTRICAL RESISTIVITY ohm cm | ↓ | 10$^{-5}$ | 10$^{15}$ | 10$^5$ | 10$^{13}$ | <10$^{-3}$ |
| FLEXURE STRENGTH MPa | ↑ | 70 | 450 | 450 | 200 | 450-650 |
| FRACTURE TOUGHNESS MPa-m$^{1/2}$ | ↑ | 23 | 4 | 3.5 | 1-5 | 4-8 |
| HARDNESS Kg/mm$^2$ | ↑ | 30 | 2000 | 2500 | 650 | 700-1700 |

COMPUTER DISK SUBSTRATE, THE PROCESS FOR MAKING SAME, AND THE MATERIAL MADE THEREOF

This application is a divisional of application Ser. No. 08/496,798, filed Jun. 29, 1995, now abandoned which is a continuation-in-part application Ser. No. 08/354,185 filed on Dec. 12, 1994, now abandoned.

BACKGROUND OF THE INVENTION

1. Field of the Invention

This invention relates to computer disk substrates, processes for making same, and materials made therefrom. More particularly this invention relates to computer disk substrates made from ceramic-based composites, processes for making same, and materials made therefrom.

2. Background of the Invention

Current trends in the computer industry are toward thinner, lighter and stiffer computer disk substrates. Conventional hard disks are commonly 635 μm thick with an outer diameter (O.D.) of 65 mm or 800 μm thick with an outer diameter of 95 mm. The conventional hard disks are typically made of aluminum substrates, polished, plated with a nickel-phosphorus coating, often texturized by one of several means, and then sputtered to place a magnetic media layer thereon. Additional layers are applied to the magnetic media layer to lubricate and protect the media.

One way for computers to be smaller, or to be the same size, but contain more memory, is for the substrates to be thinner. Aluminum disks (the current technology) begin to warp, sag, flutter, or resonate during handling and use when the thickness of a 95 mm O.D. substrate is less than 800 μm or when the thickness of a 65 mm O.D. substrate is less than 635 μm. A goal of computer companies is to produce substrates having a 65 mm O.D. that are about 381 μm thick and 95 mm O.D. substrates that are about 508 μm thick. These thinner substrates will allow more disks to be incorporated into the computer in a given volume. However they will require additional stiffness in order to prevent warping, sagging, fluttering, and resonating during handling and use. Furthermore, for portable computers, it would be an advantage to have a more lightweight substrate because the spinning action to which the disk is subjected requires a great deal of energy. A lighter substrate would require fewer or smaller batteries. Alternatively, the same batteries could be utilized, but those batteries would not be discharged as quickly as they are now.

The need for thinner media is creating a demand for alternatives for aluminum-based substrates/media in certain computer applications. In 1992, over 100 million disk substrates were sold, virtually all of them aluminum. By 1993, non-aluminum disk substrates were approximately 5% of the market. In 1994, non-aluminum disk substrates were approximately 10% of the market. It has been estimated that by the year 2000, nearly 60% of all the disks sold in the computer industry will be non-aluminum disk substrates.

Because aluminum disks cannot be made much thinner without sacrificing stiffness and increasing spin distortion, certain alternative materials have been proposed, including glass and ceramic substrates. Both of these materials fulfill some of the property requirements for the substrates. Those properties include a low material density, a high stiffness, a high thermal conductivity, a high electrical conductivity (or, its converse, a low electrical resistivity), and a good surface texture for receiving a plated layer or sputtered magnetic media layer. While glass and ceramics meet certain of these requirements, an additional requirement which is not met by them is the requirement for the material to be tough, i.e., to be non-breakable when dropped. The substrates should be non-breakable under dropping conditions even when the substrates are thinner than current substrates. As portable computers are becoming more and more prevalent, breakage of thinner, fragile substrate materials increasingly becomes a problem. As one can imagine, there was not a breakage problem with the aluminum substrates. However, the alternative substrate materials which are currently being proposed do have this problem.

With the proliferation of portable computers has come the need to prevent damage to hard disks from the forces exerted by movement of the computer. Where desktop computers may be moved several times in their useful life, the portable computer is moved almost every time it is used and often between uses. During transportation, the computer and all its components are subjected to rapid acceleration when it is placed on or bumped against a surface. The forces on the read/write head are quite high during this acceleration, and the head hits the hard disk with substantial momentum. This striking of the disk is known in the industry as head slap. Damage resulting from head slap includes destruction of data and hard drive crashes. Aluminum disks are not as resistant to head slap as drive manufacturers would like, so the manufacturers have begun to use alternative, harder substrates, such as glass, to minimize the potential for damage. However, it is still desirable to have a material available for disk substrates which has a higher hardness than glass.

In addition, the disk substrate material should be capable of being "texturized." In order to prevent stiction, which is the resistance to motion that occurs when two highly polished surfaces are in static contact, a texturized substrate surface is required. Conventionally, the aluminum substrate is plated with a nickel or nickel-phosphorus coating. The nickel or nickel-phosphorus layer is texturized prior to receiving a sputtered magnetic media layer thereon. Consequently, a preferred substrate material would be easily texturized or one which is automatically texturized.

Other problems which are created by the new, brittle alternative substrates such as glass and ceramics include the lack of shock resistance and the lack of resistance to damage during head-and-disk assembly. Edge chipping and cracking are observed on the alternative substrates due to their brittleness. Not only does a chip or crack tend to render the disk useless, an undetected particle of the substrate which is left in the drive during assembly will likely cause a drive crash. And, unfortunately, most alternative substrates are dielectrics, which cause static charges to easily build up on the surfaces which, in turn, leads to particle contamination and data destruction. The electrical and thermal conductivity which is necessary to "wick" away static build-up and heat build-up are not prevalent in these glass and ceramic substrates.

Finally, substrates which are not electrically conductive are susceptible to write-through, which occurs when the information being written on one side of the disk potentially harms or destroys data on the opposite side of the disk. This is particularly troublesome on the disk which controls the read/write head position. On this disk, used by many manufacturers, the servo information is written on one side of the disk. This information is never re-written, so any write-through is cumulative and potentially destructive to the entire drive which will not function without perfect servo information.

In an effort to solve all of these problems, prior art materials and methods for alternative substrate materials have generally included ceramics and glass, e.g., silicon carbide ceramic and "Canasite," a partially-crystallized glass or ceramic/glass, available from Corning, Inc., under the trade name MEMCOR. However silicon carbide has a very high cost, is relatively dense, and therefore quite heavy, and has a low electrical conductivity. Other than that, it has good stiffness and good surface finish properties. "Canasite" glass has a low cost, although it is more susceptible to breakage, is difficult to finish due to edge chipping and it has relatively low stiffness. In addition, surface ion diffusion problems in "Canasite" have tended to ruin the magnetic layer, and "Canasite" also suffers from poor electrical conductivity. Alumina ceramic has certain appealing properties, although it has a high density, and an electrical resistivity of $10^{15}$ ohm-cm; making it in essence, an electrical non-conductor or dielectric, when an electrical conductor is desirable. Furthermore, sintered thin pieces of alumina shrink substantially during heat treatment steps making it difficult to maintain a flat substrate.

Therefore, it would be most advantageous to the industry to have a lightweight, stiff, electrically conductive substrate material, which may be a sputter-ready textured substrate, that is easy to manufacture and low in cost.

It would also be most advantageous to have a disk substrate, and a process for making same, in which the substrate has excellent physical properties and is easily texturized either in situ or following a plating process. If the disk substrate is texturized in situ, certain manufacturing steps could be eliminated and the property may eliminate the need for the nickel-phosphorus plating and allow sputtering of the magnetic coating to be performed at a more optimum temperature which is higher than presently used.

If the disk substrate formed of improved materials is texturized following plating of the disk substrate with conventional coatings, such as nickel-phosphorus, the improved disk substrate would continue to exhibit superior performance, but still allow the same post-plating media production procedures used currently in the industry since the resulting disk substrate would have a surface with which the industry is familiar.

It would also be highly preferable to have a disk substrate, and method for making same, in which the disk substrate is coated with improved coating materials which would exhibit improved properties, such as smoothness and high-temperature use, relative to the properties of the conventional coated disk substrates.

SUMMARY OF THE INVENTION

Accordingly, the present invention is a hard drive disk substrate of a multi-phase ceramic-based material having at least two phases with amorphous phases being present in an amount less than about 1 volume percent based on the volume of the ceramic-based material. Alternatively in another aspect, the disk device is a multi-phase ceramic-based material having at least two phases, at least one phase being free metal.

Also disclosed is a process for producing a ceramic-based computer disk substrate for use in hard drive computers comprising the steps of forming a flat disk of a porous ceramic and then infiltrating the porous ceramic with a metal whereby a multi-phase ceramic-based computer hard drive disk is produced. Additionally, a step of passivating the porous ceramic by elevating it to a temperature of about 1300° to about 1800° C. before the infiltrating step may be performed, such that the surfaces are passivated and the reaction kinetics can be controlled during the infiltrating step.

In another embodiment, the present invention is a composite material made of a multi-phase boron carbide composite material having an average roughness value, Ra, of between about 1 to about 200 Å, the roughness value can be tailored in situ during polishing by causing during fabrication a micro hardness gradient of between about 19 and about 3200 Kg/mm² in the various phases of the multi-phase boron carbide composite material.

More advantages and detailed aspects of the present invention will be readily appreciated and better understood after reading the subsequent description taken in conjunction with the appendant drawings.

BRIEF DESCRIPTION OF THE DRAWINGS

FIG. 1 is a side perspective view of a computer hard drive illustrating the configuration of the individual disks and the current industry trend for size reduction or memory enhancement within the same size;

FIG. 2 is a schematic of processing steps taken in substrate preparation for use in computers;

FIG. 3 is a chart of the various properties for several alternative substrates, including a preferred ceramic-based composite of the present invention.

DETAILED DESCRIPTION OF THE INVENTION

Figure 4:
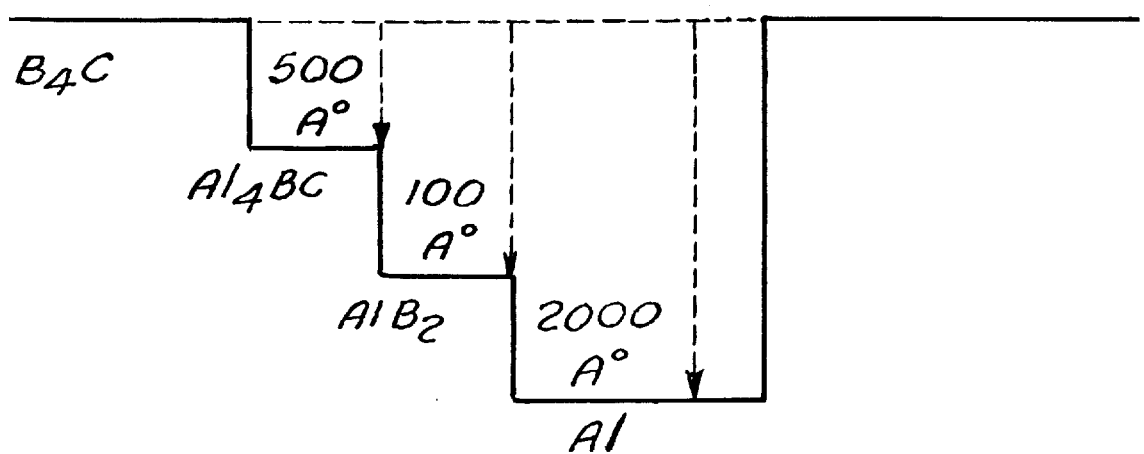
FIG. 4 is a side elevational view of the surface of the substrate after extensive polishing, illustrating the surface roughness made in accordance with the present invention.

One aspect of the present invention is a new disk substrate for use in computer hard drives which includes a disk device formed of a multi-phase ceramic-based material having at least two phases, preferably, at least three phases. The multi-phase ceramic-based material may be a multi-phase ceramic-ceramic composite material or a multi-phase ceramic-metal composite material. Preferably, each of the two phases is present in an amount of at least 5 volume percent based on the volume of the multi-phase ceramic-based material. It is also preferred that any amorphous phases are present in an amount less than about 1 volume percent based on the volume of the ceramic-based material or at least one phase is crystalline ceramic and at least one phase is free metal.

Referring first to FIG. 1, there is shown a schematic diagram, on the left, of a conventional computer hard drive configuration generally denoted by the numeral 10. On the right is the desired configuration. Included in the prior art side of the diagram are four disks 12 interleaved between the arms of "E-block" 14. At the end of the "arms" of E-block 14 are read/write heads 16 which come into close proximity of disk 12 as it is spinning during operation. A spindle and clamps 18, shown without detail, hold disks 12 in place while they are spinning. FIG. 1 shows in the figure on the top right the industry trend toward making hard drives more compact, or, in the alternative as shown in the lower right of the two diagrams, toward achieving a larger amount of memory within the same amount of space. Due to this industry trend, the physical and performance properties of the disk substrate material are in need of improvement.

Looking now to FIG. 2, a schematic diagram of the prior art steps in preparing a hard disk is shown. Aluminum substrate blank 20 is illustrated first, followed by a polished blank 22 (made by polishing aluminum blank 20). The polished blank is then nickel- or nickel-phosphorus-plated and is shown as substrate 924. The nickel- or nickelphosphorus-plated substrate is then texturized by mechanical means such that grooves have been made in the surface of the plated substrate. The texturized substrate is shown as substrate 26. The texturized substrate is then coated with magnetic media and is illustrated as substrate 28. Media-coated substrate 28 is a finished product which is ready to be used in a computer.

The multi-phase ceramic-based material used in preparing the disks of the present invention can be a ceramic-ceramic composite material or ceramic-metal composite material. The phases of some specific examples of such multi-phase ceramic-based materials include: $B_4C/AlB_{24}C_4/Al_4BC$, $TiB_2/AlB_{24}C_4/Al$, $ZrC/ZrB_x/Al$, $TiB_2/B_4C/Al$, $AlB_{24}C_4/AlB_{12}/Al_4BC$, $SiC/B_4C/Al$, $B_4C/Al_4BC/Al$, $AlB_{12}/Al_4B_{1-3}C_4/Al$, $B_4C/AlB_2/Al/Al_4BC$ and $AlB_{24}C_4/AlB_{12}/Al/SiBx$. The use of the subscript "x" represents that the compound can have a varying stoichiometry. Preferably, the material forming the disk substrate of the present invention is an aluminum-boron-carbon (Al-B-C) composite material. The Al-B-C composite material includes at least one boron-containing phase, at least one carbon-containing phase, and at least one aluminum-containing phase, wherein the phases may be admixed with a filler ceramic selected from the group consisting of borides, carbides, nitrides, oxides, silicides, and mixtures and combinations thereof. The filler ceramic is preferably employed in an amount from about 1 to about 50 volume percent based on the volume of the multi-phase ceramic-based material.

The multi-phase ceramic-based material may include relatively hard and soft phases, wherein the harder phases are preferably uniformly dispersed within the softer phases. If non-homogeneity is desired, the harder materials could be concentrated in one particular location while the softer phases could be concentrated in another. For the present application of disk substrates, it is presently desired to have a uniform surface roughness, although it is foreseen that possibly certain areas of the disk substrate may be desired to be more textured than others. It is desirable that the harder phases be present in an amount from about 30 to about 80 volume percent, more desirably, from about 40 to about 60 volume percent, based on the total volume of the material. The softer phases desirably have hardnesses which are from about 25 to about 75% lower than the harder phases and, more desirably, from about 50 to about 75% lower than the harder phases. It is also preferred that at least 50% of the ceramic interfaces between the harder and softer phases be substantially metal free.

The multi-phase ceramic-based material is preferably made from powdered ceramics of crystalline materials having grains that are between about 0.1 to about 50 micrometers in diameter, more preferably, between about 0.1 to about 5 micrometers in diameter. This may give the material a controlled surface roughness as the material will have peaks, plateaus and valleys which remain after polishing the surface due to the various hardnesses of the individual phases of the multi-phase ceramic-based composite. The crystalline particles may be in the shape of equiaxed grains, rods, or platelets. The roughness of the surface will provide a "texturized" surface which is necessary in order to prevent stiction during use.

In fact, the multi-phase ceramic-based material of the present invention may be capable of having a controlled surface roughness formed in situ during polishing, such that a disk substrate formed thereof has an average roughness value, Ra, of between about 1 and about 2000 Angstroms. Depending on various polishing techniques, the average roughness value for each of the phases included in the multi-phase material are preferably from about 1 to about 200 Angstroms. The substrate disclosed herein can have a surface finish sufficient for receiving magnetic media to be sputtered or otherwise deposited thereon. It may be desirable to apply various layers of materials between the multiphase ceramic-based material substrate and the magnetic media.

Multi-phase Ceramic-Ceramic Composite Material

The ceramic-ceramic composite material useful in the present invention may be formed from a combination of a first ceramic and a second ceramic, the first and second ceramics each independently selected from the group consisting of borides, oxides, carbides, nitrides, silicides, and combinations thereof. Examples of combinations of ceramics include borocarbides, oxynitrides, carboxynitrides, oxycarbides, and carbonitrides. More than two ceramics may be used to form the ceramic-ceramic composite material.

The ceramic powders used to form the composite material typically contain metal chemically bonded to the boron, oxygen, carbon, nitrogen, or silicon of the ceramic powders. The bonded metal may be selected from the group consisting of boron, silicon, magnesium, aluminum, titanium, vanadium, chromium, iron, nickel, copper, cobalt, tantalum, niobium, tungsten, molybdenum, zirconium, and alloys thereof.

One of the main advantages of the multi-phase ceramic-ceramic composite material relative to single-phase materials is that the additional phases (the second, the third, etc.) may act as reinforcement for the first phase, increasing the fracture toughness of the composite. For example, when one phase has equiaxed grains, the fracture toughness increases when the morphology of the additional phases is other than equiaxed, such as, rod-like or plate-like.

Specific examples of suitable combinations of first and second ceramics include $SiC/Al_2O_3$ and $TiB_2/SiC$. SiAlON is also an exemplary multi-phase ceramic-ceramic composite material suitable for the present invention. SiAlON is formed from aluminum-containing compounds, silicon-containing compounds, oxygen and nitrogen.

Multi-phase Ceramic-Metal Composite Material

A multi-phase ceramic-metal composite material useful in the present invention has at least two phases, wherein one phase is the starting ceramic and the other phase is the metal. If other phases are present, they may be products of reactions between the starting ceramic and the metal.

The ceramic-metal composite material preferably has from about 4 to about 30 volume %, more preferably, from about 4 to about 15 volume %, residual free metal. Desirably, less than about 50% of the free metal is present in the ceramic-ceramic interfaces, and, more desirably, most of the free metal is present only in the interstices.

Multi-phase ceramic-metal composite materials useful in the present invention may be made from a combination of crystalline ceramic powder and a metal, the metal being selected from the group consisting of silicon, magnesium, aluminum, titanium, vanadium, chromium, iron, nickel, copper, cobalt, tantalum, niobium, tungsten, molybdenum, zirconium, and mixtures and alloys thereof. The metal may or may not be reactive with the ceramic powder at elevated temperatures, e.g., at melt temperatures of the metal and higher. The ceramic powder may be selected from the group consisting of borides, oxides, carbides, nitrides, silicides, and mixtures and combinations thereof. Examples of combinations of ceramics include borocarbides, oxynitrides, oxycarbides, and carbonitrides.

The ceramic powder used to form the composite material typically contains metal chemically bonded to the boron, oxygen, carbon, nitrogen, or silicon of the ceramic. The bonded metal may be selected from the group consisting of boron, silicon, magnesium, aluminum, titanium, vanadium, chromium, iron, nickel, copper, cobalt, tantalum, niobium, tungsten, molybdenum, zirconium, and alloys thereof.

Specific examples of combinations of ceramic and metal for forming the multi-phase ceramic-metal composite material include: $B_4C/Al$, $SiC/Al$, $AlN/Al$, $TiB_2/Al$, $Al_2O_3/Al$, $SiB_x/Al$, $Si_3N_4/Al$, $SiC/Mg$, $SiC/Ti$, $SiC/Mg$-$Al$, $SiB_x/Ti$, $B_4C/Ni$, $B_4C/Ti$, $B_4C/Cu$, $Al_2O_3/Mg$, $Al_2O_3/Ti$, $TiN/Al$, $TiC/Al$, $ZrB_2/Al$, $ZrC/Al$, $AlB_{12}/Al$, $AlB_2/Al$, $AlB_{24}C_4/Al$, $AlB_{12}/Ti$, $AlB_{24}C_4/Ti$, $TiN/Ti$, $TiC/Ti$, $ZrO_2/Ti$, $TiB_2/B_4C/Al$, $SiC/TiB_2/Al$, $TiC/Mo/Co$, $ZrC/ZrB_2/Zr$, $TiB_2/Ni$, $TiB_2/Cu$, $TiC/Mo/Ni$, $SiC/Mo$, $TiB_2/TiC/Al$, $TiB_2/TiC/Ti$, $WC/Co$, and $WC/Co/Ni$. The use of the subscript "x" represents that the compound can have a varying stoichiometry.

Preferably, the material forming the disk substrate of the present invention is a boron-carbide-based material. Boron carbide ceramic may be combined with any metal to form the boron-carbide-based material, although aluminum is the preferred metal, thus, forming an Al-B-C composite material. Aluminum is the preferred metal because it is lightweight, thermally conductive and highly reactive with the boron carbide ceramic. Aluminum is best employed as an alloy which provides improved stiffness relative to pure aluminum. Examples of such alloys are 6061 alloy, 7075 alloy, and 1350 alloy, all being produced by the Aluminum Company of America, Pittsburgh, Pa.

A unique characteristic of the Al-B-C composite material is the flexibility of its chemistry, microstructure, and properties. Depending on the starting materials and their respective levels, the thermal history, and the processing conditions used to form the Al-B-C composite material, different Al-B-C products can be fabricated. These products range from rich in metal to metal deficient.

The Al-B-C composite materials are ideal for use in forming disk substrates because of the properties and the physical performance of the materials. For instance, the Al-B-C composite material can have a density of less than about 3 g/cc, preferably, from about 2.58 to about 2.7 g/cc, an elastic modulus of at least about 220 GPa, preferably, from about 220 to about 380 GPa, a flexure strength value of at least about 450 MPa, preferably, from about 450 MPa to about 650 MPa, a fracture toughness value of at least about 4 MPa-m$^{1/2}$, preferably, from about 4 to about 12 MPa-m$^{1/2}$, a Vickers hardness of at least about 700 Kg/mm$^2$, preferably, from about 700 to about 1700 Kg/mm$^2$ determined with a 30-pound load, an electrical resistivity value of at most about $10^{-3}$ ohm-cm, preferably, between about $10^{-5}$ and $10^{-3}$ ohm-cm, a thermal conductivity of about 20 to about 40 W/m-°C. (as measured at 200° C.), a coefficient of thermal expansion from about $5.3\times10^{-6}$ to about $7.1$–$10^{-6}$/°C., and the ability to be finished to a surface roughness of less than about 200 Angstroms. In addition, the Al-B-C composite material typically experiences less than about a 2% dimensional change upon densification.

Other key properties of the Al-B-C composite material are its specific stiffness and its coefficient of thermal expansion. Specific stiffness is a property of a material which quantifies the resistance of a component to deflection by inertial loads generated by accelerations and decelerations. Specific stiffness is defined to be the modulus of elasticity of a material under tension divided by the density of the material. The specific stiffness of the Al-B-C composite material can be greater than about $8.3\times106$ m, preferably, greater than about $14.3\times106$ m wherein the specific stiffness has been normalized by the acceleration due to gravity (9.8 m/s$^2$). Advantageously, this material has a coefficient of thermal expansion which is close to that of alumina which is about $7$–$8\times10^{-6}$/°C. Therefore, if some internal computer components, such as the journal bearings, are formed of alumina and the disk substrate is formed of the Al-B-C composite material, it is fortunate that the two materials will expand approximately the same amount when exposed to the heat generated during use.

The Al-B-C composite material is an unexpectedly good candidate material for hard drive disk substrates, as the properties of the composite material are not similar to the materials that are currently used for disk substrates today. FIG. 3 is a chart of comparative properties for non-aluminum computer disk alternative substrate materials. The arrows indicate whether or not a higher or lower value is more desirable. While attempting to produce a substrate that is lower in weight, higher in electrical conductivity, tougher and harder than its aluminum predecessors, the Al-B-C ceramic is excellent. Its density is lower than the others, its electrical conductivity nearly rivals pure metallic aluminum, its stiffness is excellent, its fracture toughness is very good, and its hardness is more than satisfactory. As one can see, all the properties needed for a substrate are easily met or exceeded by the Al-B-C composite material.

The Al-B-C composite material typically includes the phases of $B_4C$, $AlB_{24}C_4$, $Al_{3-4}BC$, $AlB_2$, $AlB_{12}$, $AlB_{12}C_2$, $Al_4B_{1-3}C_4$ and free metal Al. The most preferred material is a multi-phase material made of $B_4C$ grains, Al, and at least three other ceramic phases, preferably, $AlB_{24}C_4$, $Al_{3-4}BC$, and $AlB_2$. The $B_4C$ grains are preferably less than about 10 micrometers and are desirably surrounded by Al-B and Al-B-C phases. In other words, the composite material has a continuous ceramic network of Al-B, B-C, and Al-B-C phases. This specific combination of phases in a boron carbide ceramic-based material exhibits a micro hardness gradient from about 19 to about 3200 Kg/mm$^2$. The free metal aluminum has a micro hardness of 19 Kg/mm$^2$, while the hardness of $B_4C$ is from about 2750 to 3200 Kg/mm$^2$. $AlB_{12}$ has a micro hardness of about 2600 Kg/mm$^2$, while $AlB_{24}C_4$ has a value of 2530 to 2650 Kg/mm$^2$. The micro hardness of $Al_{3-4}BC$ is around 1300–1400 Kg/mm$^2$, while that of $AlB_2$ is around 980 Kg/mm$^2$.

FIG. 4 demonstrates the "stepped" roughness of the surface of the Al-B-C composite material substrate after polishing. The step values, which are the average roughness values, Ra, will differ with various polishing compounds and techniques. For example for a given polishing procedure, the $B_4C$ phase is the hardest and, therefore, lasts through the polishing step with little material being removed. The next softer phase, $Al_4BC$, has about 500 Å of material removed, followed by $AlB_2$ which has about 700 Å of material removed, and ultimately pure metallic aluminum, if any is left after the reactions take place, will have as much as 2000 Å of material removed. Depending on the polishing conditions, the differences in the steps can be significantly reduced, thus, leading to a lower Ra. This effect can provide "automatic" texturizing, as formed in situ during polishing, by the present invention. The hardness of the phases can be substantially controlled by the use of the process of the present invention, which consequently controls the "automatic" texturizing of the substrate surface.

Methods of Making Disk Substrates

One way of making the disk substrate formed of the multi-phase ceramic-based composite material is by blending together appropriate powders, forming a preform of the blended powders, and pressure or pressureless sintering the preform. Appropriate powder mixtures may be, e.g., ceramic/ceramic powder mixtures or ceramic/metal powder mixtures. The blending of the powders may be done by any conventional technique, such as dry milling or wet milling. Forming the preform of the powders may be done by conventional techniques such as tape casting, extruding, injection molding, die pressing, roll compacting, compression molding, and slip casting. The porous body preferably has a porosity of from about 10 to about 75%, more preferably, from about 25 to about 50%, and, most preferably, from about 25 to about 35%. The porous body may be typically formed to a thickness of from about 25 to about 750 micrometers. To form the preform, binders may be added to the powders before forming the preform. If a binder is used, it may be desirable to perform debindering operations, e.g., heating the preform in an inert atmosphere to a temperature which burns off the binder.

The preform may then be pressure or pressureless sintered to a density of greater than 98% theoretical density, more preferably, greater than 99.5% theoretical density.

After sintering, the densified body can be machined to the final shape desired and/or polished with polishing media. In addition, the densified body may be coated on its surface to improve its smoothness or provide other desired characteristics as discussed further hereinbelow.

Another aspect of the present invention involves a method of forming the multi-phase ceramic-based material including the steps of forming a porous body of ceramic and thereafter infiltrating the ceramic with a metal to form a disk substrate. Forming the porous body can be accomplished by tape casting ceramic powder, where the powder preferably has a grain size of from about 0.1 to about 50 micrometers, although the more preferred powder size has a mean diameter grain size of less than about 10 micrometers and, most preferably, less than about 5 micrometers. Preferably, for packing purposes, the powder has a broad particle size distribution within the above range.

The speed of reaction (i.e., the kinetics) affects the phases and morphology in the material and is controlled to make the desired material. For example, when a boron carbide is the precursor ceramic material, it is especially advantageous if there is an increased amount of carbon within the carbide structure to reduce the reactivity of the carbide and increase the number of phases within the product under more controlled circumstances. Although there may be a similar number of phases without such control, it is much easier to know which phases are present if it is controlled by lessening the reactivity of the carbide precursor material.

As another way to control the phases and morphology in the material, it is often advantageous to include a step of passivating the porous body of, e.g., boron carbide ceramic, by elevating it to a temperature of about 1300° to about 1800° C. before the infiltration step, such that the surfaces are passivated and the reaction kinetics can be controlled during the infiltration step. Passivation may be performed at a temperature above 1800° C.; however, further improvement in the passivation is not observed above this temperature. This step of passivating is preferably accomplished at a temperature of between about 1400° to about 1450° C. The passivating step can take place in nitrogen, argon, or any other gas, but is preferably accomplished under an argon blanket for a period of time from about 1 minute to about 20 hours. The thickness of the porous body will greatly determine how long this passivating step should be in order to receive the benefits throughout the bulk of the porous body material.

If the ceramic-based composite material requires less control over surface smoothness, the passivation step can be omitted. When the passivation step is omitted, the porous body is directly infiltrated with the metal. Infiltration of a non-passivated ceramic body provides disk substrates with from about 25 to about 50 volume percent binary and ternary Al-B-C reaction phases. This type of product can achieve an average surface roughness up to about 20–30 Angstroms. Further improvement in the surface smoothness, phase uniformity, or achieving narrow peak-to-valley ranges requires additional control over the phases and the surface morphology of the material and would, therefore, dictate that the passivation step be performed.

After the passivating step, the step of infiltrating may be accomplished by heat (melt) infiltrating, vacuum infiltrating, pressure infiltrating, gravity/heat infiltrating, and other known methods. For example, the step of infiltrating may be accomplished by sandwiching the porous body of ceramic between two pieces of metallic foil and thereafter heating to a sufficient temperature to melt the metallic foil and thereby infiltrate and wet the porous body with the metal. The melting point of the metal in the metallic foil will dictate the temperature at which the infiltration should be performed. For instance, if aluminum is used, the infiltration step can be accomplished at a temperature greater than about 700° C., but preferably from about 900° C. to about 1200° C. Furthermore, infiltration can be accomplished under vacuum, under atmospheric pressure, or under pressure. The atmosphere may be formed of an inert gas, such as argon. When pressure is applied, the infiltration temperature can be lowered. One of ordinary skill in the art will know many different ways of melting metal and incorporating it into the pores of a porous ceramic. The preferred metal to be used is aluminum, and it is especially preferred to sandwich boron carbide between two pieces of aluminum foil and heat the structure such that the aluminum is integrated into the porous boron carbide.

During metal-infiltration of the porous body of ceramic, the porous body may be placed between refractory plates to help maintain the shape of the porous body. For example, a porous body of ceramic may be first sandwiched between foils of aluminum. Then, aluminum nitride substrates coated with aluminum nitride powder may be placed on the outer sides of the aluminum foils. Therefore, the stack, from top to bottom, would consist of an aluminum nitride substrate, aluminum nitride powder, aluminum foil, the porous body of ceramic, aluminum foil, aluminum nitride powder, and an aluminum nitride substrate. Aluminum nitride was the chosen material for the refractory substrates and the powder, as aluminum nitride is not generally wettable by molten aluminum, and the aluminum, thus, would infiltrate only the porous body of ceramic. Many different stacking configurations of ceramic tape/metal foil are possible, and none are being excluded here.

The infiltration is performed until the metal-infiltrated ceramic body is substantially dense, thereby densifying the ceramic body to greater than 98% theoretical density, more typically, greater than 99.5% theoretical density. Using metal infiltration to densify the ceramic body, the ceramic body typically undergoes less than about a 2% linear shrinkage upon densification.

Variation in the stiffness of a multi-phase ceramic-based material may be achieved without significant changes in density by manipulation of the level of ceramic used and/or leaving larger amounts of unreacted metal within the ceramic grains.

An additional step of heat treatment after the infiltrating step may increase the amount of reacted metal and the uniformity of the multi-phase ceramic-based material. In the case of Al-B-C, particularly, this additional step of heat treating is preferably accomplished by heating the infiltrated body to a temperature of from about 625° to about 1000° C. for a period of time of at least one hour. The preferable heat treatment temperature is from about 625° C. to about 900° C., and the preferable time period for the heat treatment is from about 25 to about 50 hours. The heat treatment may be performed in, e.g., air, nitrogen, or argon. It is during this heat treatment that the greatest control over the formation of multi-phases is achieved. The heat treatment can be for a long period of time at a low temperature or it may be for a shorter period of time at a higher temperature.

The bulk properties of the multi-phase ceramic-based material may be controlled by altering the processing conditions, including thermal treatment of the starting ceramic prior to contact with the metal, infiltration temperature and time, and heat-treatment of the infiltrated ceramic body.

After the infiltration step and after the optional heat-treatment step, the infiltrated body is cooled to solidify the infiltrated metal. The infiltrated body may then be polished with polishing media and/or machined to the final shape desired. It may be desirable to polish the infiltrated disk with polishing media such that the surface of the disk has a substantially uniform average roughness value of between about 1 and about 2000 Å. The harder phases, e.g., $B_4C$, will resist polishing more than the softer phases, such as the free metallic aluminum, leading to the formation of peaks, plateaus, and valleys in the material. These peaks and valleys determine the texturing or the roughness of the surface. As discussed above, it has been noted by stylus profilometry that it is nearly a step function of heights at the surface after the polishing has taken place. It is this texturizing that can lend a distinct advantage to the present invention because it may be possible that the nickel-phosphorus coating will not be necessary. If the nickel-phosphorus coating is eliminated, the temperature at which the magnetic media layer is sputtered could be higher because the nickel-phosphorus layer limits the temperature to approximately 270° C. (which is the transition temperature from amorphous to crystalline for nickel-phosphorus).

If a sub-surface (below the magnetic media layer) coating is desirable, the sub-surface material may be metal (e.g., chromium, nickel, cobalt, silicon, aluminum, copper, titanium, or magnesium), metal alloy, metal oxide, metal nitride, metal carbide, glass, ceramic, polymeric materials, and combinations thereof. The coating may be crystalline or amorphous. The coating method may be any that provides dense coatings, e.g., atomic deposition, particulate deposition, bulk coating, or surface modification. The most typical method of nickel coating is electroplating. The coating itself may be further treated to provide a textured surface either over the entire surface (data surface and landing zone) or a portion of the surface (e.g., the landing zone). The further treatment may be accomplished by techniques, such as, mechanical techniques, chemical or optical techniques, electrical techniques, or a combination thereof.

An advantage to using an alternative coating material instead of the traditional nickel-phosphorus coating is that the alternative coating material may allow high-temperature application (greater than about 270° C.) of the magnetic media layer. Having the option of applying magnetic media at a temperature greater than 270° C. makes it possible to use magnetic media materials, such as barium ferrite ($BaFe_{12}O_{19}$), which require higher application temperatures. These magnetic medias have higher coercivities than that of traditional magnetic media corresponding to higher performance. Another way of achieving a higher coercivity than that of traditional magnetic media is by improving existing magnetic medias with the addition of various metals (which also require higher application temperatures). For example, the following combinations of materials are improved versions of existing magnetic media: Co-Cr-Ta, Co-Cr-Pd, Co-Ni-Cr, Co-Ti, and Co-Ti-$BaFe_{12}O_{19}$. Furthermore, the option to use higher application temperatures allows for the development of a variety of new, improved magnetic media. The high-temperature magnetic media may be applied directly to the disk substrate or it may be applied on a high-temperature resistant sub-surface layer which has been applied to the disk substrate. For instance, when the disk substrate surface is too rough or the growth orientation of the grains in the magnetic media dictate it, the magnetic media layer may be applied to a high-temperature resistant sub-surface layer.

On the other hand, the advantage of having nickel coated on the disk substrate is that the current industry procedures and types of magnetic media may be used. Depending on the type of substrate and the required properties, such as the level of hardness or level of smoothness, different alloying elements, such as phosphorus, copper, and chromium are added with the nickel.

The multi-phase ceramic-metal composite material used in the present invention also has the advantage of acquiring a better adhesion between the composite material and the coating material (e.g., nickel-phosphorus coating) than the adhesion between conventional aluminum disk substrates and nickel-phosphorus. Polishing of the composite material disk substrate preferentially removes some of the free metal from the surface, leaving valleys in the surface. When the coating material is then coated on the polished surface, the coating material fills substantially every free space at the surface, including the valleys, providing additional mechanical adhesion between the composite material and the coating.

In addition, the chemistry of a composite material/metal coating interface is different than the chemistry of an aluminum/metal coating interface. In the case of the aluminum disk substrate, the metal (e.g., nickel-phosphorus) layer adheres directly to aluminum. In the case of the ceramic-based material disk substrate, the layer of pure metal is separated from the ceramic-based material disk substrate by a transition zone formed primarily of a ceramic-and-coating-metal composite wherein the ceramic is the starting ceramic and the metal is the coated metal. For example, in the case of a boron carbide/aluminum composite material coated with nickel, the transition zone would consist mostly of $B_4C$-nickel. The transition zone is typically from about 1 to about 10 micrometers thick, more typically, from about 1 to about 5 micrometers thick, depending on plating conditions.

Whether or not a sub-surface layer of, e.g., nickel or nickel-phosphorus, has been deposited onto the multi-phase ceramic disk substrate, a further step may include sputtering a magnetic media coating on the substrate. The magnetic media coating may have a thickness of from about 100 to about 1000 Angstroms and may have a composition such as cobalt-nickel, cobalt-iron cobalt-nickel-phosphorus, cobaltrhenium, cobalt-platinum, cobalt-chromium, cobalt-nickel-chromium, and cobalt-chromium-tantalum.

Accordingly, the present invention provides hard drive disk substrates, methods of making same, and materials made therefrom, wherein the material has a high hardness, a high wear resistance, a high fracture toughness, a high damping capability, a low density, and a high specific stiffness and is electrically conductive. In addition, the material forming the disk substrates exhibits unique combinations of properties, such as high stiffness and high toughness, high hardness and high strength, and high stiffness and high damping capability. Furthermore, the material forming the disk substrates undergoes a low amount of shrinkage upon densification.

The following examples are illustrative only and should not be construed as limiting the invention which is properly delineated in the appended claims.

EXAMPLES

The following examples were all made using the material prepared as described below. However, each example will discuss the various ways that the substrate material was formed into blanks, or tapes, used to make the substrates. Following the making of the blank, the blank can be machined into a substrate configuration and the magnetic media layer can be sputtered thereon. The first step of the examples, i.e., tape casting, involves the preparation of a fully dispersed aqueous suspension of boron carbide powders. ESK 1500 $B_4C$ powder (ESK specification 1500, manufactured by Elektroschemeltzwerk Kempten of Munich, Germany, and had an average particulate size of 3 pm) was dispersed in water at a powder loading of 55 vol. %, based on the total volume of the suspension, at a pH of 7. In addition, ultrasonication was applied repeatedly in order to facilitate the break-up of soft agglomerates. Once the suspension was prepared, hard aggregates and foreign debris were then removed by screening the suspension using a 635 mesh filter. After screening, the suspension was degassed in order to eliminate trapped air bubbles. These trapped air bubbles not only lead to voids in tapes, which might not be filled completely during infiltration of molten Al, but they may also lead to fine cracks during drying.

After the suspension was prepared, a latex binder such as Rhoplex HA-8, sold under the trademark owned by Rohm & Haas of Cambridge, Mass. was added. One advantage of using this particular latex over other such latexes was that the dispersant included in this latex enhanced the wetting of the aqueous suspension on the hydrophobic Mylar film on which the suspension was being cast into tapes. Consequently, no other wetting agent was necessary. In order to produce flexible tapes which could then be cut without damage, a 7% latex based on the boron carbide powder weight was deemed sufficient. However, in order to produce tapes which can be stacked in multiple layers, it is preferred to use about 10% latex binder based on the powder weight. When the latex binder was then added to the suspension, care was taken not to introduce any air bubbles.

The resulting boron carbide suspension and latex binder mixture was cast into a multitude of thicknesses of tapes on oriented polypropylene film (Mylar D film) using a Doctor blade that moving at 1.8 cm/sec. After casting, the tapes were dried in an ambient environment without using any type of special apparatus. Tapes of up to 20 mil (500 micrometer) thick were dried without cracking. A drying time range of from 10 min. to 12 hours was needed depending upon the thickness of the tapes. After the drying process was completed, the tapes were then peeled off the Mylar film and cut to their desired size. These tapes could also be stacked one on top of the other as well as being adhered together by pressing uniaxially at ambient temperatures.

After tape casting, the next step involved was to debinder the tapes in a reasonably short time without any cracking or warping. Both laminated and single tapes of various thicknesses were placed between refractory plates and then heated to 500° C. at a rate of 100° C./h, soaked for 2 hours at 500° C. and cooled at a rate of 100° C./h to ambient temperature in flowing nitrogen. The resulting debindered tapes were flat and free of cracks. The total debindering time was less than one day. After debindering, the porous tapes were infiltrated with molten Al. Using Al foil, the debindered tapes were assembled in various ways in order to prevent the tapes from warping during infiltration and cooling.

Each of the following examples utilize the aluminum boron carbon material described above in various configurations in order to infiltrate the boron carbide with aluminum. Numerous other reactive metals have been utilized either through vacuum infiltration or through melting a foil in the nearby vicinity to the ceramic. In order to keep the tapes flat, the following methods were attempted.

Example 1

An aluminum nitride "setter" had received thereon first a layer of aluminum foil, having a tape of boron carbide set thereon. The tape was heated so that the aluminum could infiltrate the porous ceramic in an argon atmosphere at a temperature of about 900° C. This method formed a functional tape.

Example 2

The same aluminum nitride setter was used as in Example 1, but the tape of boron carbide ceramic was "sandwiched" between two pieces of aluminum foil. The infiltration temperature and atmosphere conditions of Example 1 were also used for this example. A satisfactory tape was produced.

Example 3

A tape was prepared by the procedure of Example 2, however an aluminum nitride "setter" plate was placed on top of the tape as well as underneath, and the same heating and atmosphere conditions for infiltration were followed as with the previous examples. This method produced a good tape.

Example 4

An aluminum nitride setter plate was laid down, and a tape of boron carbide was laid on top of it. Pure aluminum pellets were stacked three pellets deep on top of the boron carbide tape, and heated in order to melt the aluminum, thereby infiltrating the aluminum into the pores of the boron carbide ceramic tape. This produced a functional tape.

Example 5

A boron carbide tape was sandwiched between two aluminum nitride setter plates, however the upper plate was divided down the middle, and aluminum pellets were stacked between the divided setter plate and the arrangement was placed in an oven. The temperature of the oven was increased, and, consequently, as the temperature increased, the aluminum melted and seeped between the divided aluminum nitride setter plate and through the pores of the boron carbide ceramic tape. A functional tape was produced by this method.

Example 6

An alternating configuration of (a) an aluminum nitride setter plate, (b) a piece of aluminum foil, and (c) a tape of boron carbide ceramic were stacked four layers high to produce multiple tapes. The stack was then heated to melt the aluminum foil and infiltrate the boron carbide. This method provided functional tapes.

Example 7

An aluminum nitride setter plate was set down, followed by a piece of aluminum foil, following by a tape of boron carbide ceramic, followed by another aluminum nitride setter plate. The arrangement was then heated to melt the aluminum foil and infiltrate the boron carbide. This produced a satisfactory tape.

Among the methods used in Examples 1–7, the method which was deemed to be the most effective in producing flat Al-B-C tapes was the method of Example 3 in which the boron carbide ceramic tape was symmetrically assembled between two Al foil pieces. This was apparently due to the fact that aluminum has a different thermal expansion coefficient than the ceramic. By putting the Al foil on both sides, both sides expanded at the same rate, leaving the tape flat.

Example 8

A boron carbide tape, prepared according to the procedures described above, was passivated at 1425° C. for 1 hour. Aluminum was then infiltrated into the passivated boron carbide tape according to the procedures of Example 3. The infiltrated tape was then heat-treated at 700° C. for 25 hours in air. The heat-treated tape had a homogeneous microstructure and chemical composition consisting mainly of $B_4C$, $Al_4BC$, $AlB_2$, and Al. The heat-treated tape had a Vickers hardness of 1400 Kg/mm$^2$ measured with a 30-pound load, a fracture toughness of 6.3 MPa-m$^{1/2}$, a flexure strength of 520 MPa, an electrical conductivity of $10^{-4}$ ohm-cm, and a Young's modulus of 290 GPa.

Example 9

A boron carbide tape, prepared according to the procedures described above, was not passivated but was directly infiltrated in the manner described in Example 3. No heat-treatment was performed on the infiltrated tape. The composition of the infiltrated tape consisted mostly of $B_4C$, $AlB_2$, $AlB_{24}C_4$, $Al_4BC$, Al, and $AlB_{12}$. The infiltrated tape had a Vickers hardness of 825 Kg/mm$^2$ measured using a 30-pound load, a toughness of 7.5 MPa-m$^{1/2}$, a flexure strength of 590 MPa, an electrical conductivity of $10^{-4}$ ohm-cm, and a Young's modulus of 235 GPa.

Example 10

Four green boron carbide tapes were laminated by pressing them together in a cold isostatic press at 30,000 psi pressure. The laminate was then debindered and sandwiched between two aluminum sheets. The sandwiched structure was heated to 1000° C. in vacuum to allow molten aluminum to wick into the porous boron carbide. A functional laminate was produced by this method. The laminate had a thickness of 45 mils (1125 micrometers). Next, excess aluminum, which was on the surface of the boron carbide laminate, was removed by sanding with 220 grit SiC paper. The laminate was then ground to 31.5 mils thick, lapped to 25 mils using 6-micrometer and 1-micrometer diamond paste, and then lapped for 4 hours with colloidal $SiO_2$. The resulting surface roughness, Ra, was 30 Angstroms and the peak-to-valley difference was about 300 Angstroms.

Example 11

An aluminum-boron-carbon laminate was produced in the manner described in Example 10 up to and including removing the excess aluminum. The laminate was then ground to about 1600–2000 Angstroms roughness, cleaned in acetone for one minute, and cleaned in methanol for one minute. The laminate surface was then zincated by immersing the laminate in a solution containing 100 grams ZnO, 525 grams NaOH, and 1 liter of HPLC-grade water. After the zincation, the laminate was rinsed under running water for 1 minute.

The laminate was then submersed in "Niculoy" 22 Solution, a nickel-containing solution produced by the Shipley Company, Inc., for 1 hour. The temperature of the "Niculoy" 22 Solution was 85° C. After the submersion in the "Niculoy" Solution, the laminate was again rinsed under running water for 1 minute. The resulting laminate had a dense nickel coating having an average thickness of 16–18 micrometers. A cross-section of the nickel-plated laminate indicated a unique formation of a $B_4C$-Ni transition zone between the nickel plating and the Al-B-C composite material.

Example 12

An Al-B-C tape was ground and lapped to a surface finish of about 180 Angstroms. The ground and lapped tape was then electroplated with copper using a water-based electroplating solution maintained at 20° C. and containing $CuSO_4$ at a level of 188 grams/liter of solution, $H_2SO_4$ at a level of 74 grams/liter of solution, and wood glue at a level of 1 drop/500 ml of solution. The electroplating was conducted using a voltage of 1 volt and a current of 0.6 to 0.8 Amp. After 3 minutes of electroplating, the copper plating was uniform and adhered well to the Al-B-C tape.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced otherwise than as specifically described.

What is claimed is:

1. A hard drive disk substrate comprised of an aluminum-boron-carbon composite, the composite having from about four volume percent to about thirty volume percent of free aluminum metal, the composite having a density greater than ninety eight percent of theoretical density wherein the substrate is formed by a process that melts the aluminum.

2. A hard drive disk substrate comprised of an aluminum-boron-carbon composite, the composite having from about four volume percent to about fifteen volume percent of free aluminum metal, the composite having a density greater than ninety eight percent of theoretical density wherein the substrate is formed by a process that melts the aluminum.

3. The hard drive disk substrate of claim 1 having a nickel-containing layer thereon.

4. The hard drive disk substrate of claim 1 having a nickel-containing layer thereon and a magnetic media layer deposited on the nickel-containing layer.

5. The hard drive disk substrate of claim 1, wherein the composite includes at least three ceramic phases other than $B_4C$ as well as the phases $B_4C$ and Al.

6. The hard drive disk substrate of claim 5, wherein the substrate has a layer of metal thereon and a transition zone between the substrate and the layer of metal, the transition zone comprising a composite of the $B_4C$ and the metal.

7. The hard drive disk substrate of claim 1, wherein the composite comprises aluminum and a continuous ceramic network of boron carbide grains, aluminum-boron phase and aluminum-boron-carbon phase.

8. The hard drive disk substrate of claim 7, wherein most of the aluminum is in the intersticies of the boron carbide grains, the aluminum-boron phase and the aluminum-boron-carbon phase.

9. The hard drive disk substrate of claim 7 having a nickel-containing layer thereon.

10. The hard drive disk substrate of claim 2 having a nickel-containing layer thereon and a magnetic media layer deposited on the nickel-containing layer.

11. The hard drive disk substrate of claim 2, wherein the composite includes at least three ceramic phases other than $B_4C$ as well as the phases $B_4C$ and Al.

12. The hard drive disk substrate of claim 11, wherein the substrate has a layer of metal thereon and a transition zone between the substrate and the layer of metal, the transition zone comprising a composite of the $B_4C$ and the metal.

13. The hard drive disk substrate of claim 2, wherein the composite comprises aluminum and a continuous ceramic network of boron carbide grains, aluminum-boron phase and aluminum-boron-carbon phase.

14. The hard drive disk substrate of claim 13, wherein most of the aluminum is in the intersticies of the boron carbide grains, the aluminum-boron phase and the aluminum-boron-carbon phase.

15. The hard drive substrate of claim 1, wherein the composite has a density of about 2.58 to about 2.7 g/cc and an elastic modulus of at least about 220 GPa.

16. The hard drive substrate of claim 15 wherein the composite has a fracture toughness of at least about 4 MPam$^{1/2}$.

17. The hard drive substrate of claim 1 wherein the composite consists essentially of the reaction product of boron carbide powder and aluminum.

18. The hard drive substrate of claim 17 wherein the composite contains $B_4C$, free aluminum metal and at least three reaction products selected from the group consisting of $AlB_{24}C_4$, $Al_{3-4}BC$, $AlB_2$, $AlB_{12}$, $AlB_{,12}C_2$ and $Al_4B_{1-3}C_4$.

19. The hard drive substrate of claim 2, wherein the composite has a density of about 2.58 to about 2.7 g/cc and an elastic modulus of at least about 220 GPa.

20. The hard drive substrate of claim 19 wherein the composite has a fracture toughness of at least about 4 MPam$^{1/2}$.

21. The hard drive substrate of claim 2 wherein the composite consists essentially of the reaction product of boron carbide powder and aluminum.

22. The hard drive substrate of claim 21 wherein the composite contains $B_4C$, free aluminum metal and at least three reaction products selected from the group consisting of $AlB_{24}C_4$, $Al_{3-4}BC$, $AlB_2$, $AlB_{12}$, $AlB_{12}C_2$, and $Al_4B_{1-3}C_4$.

* * * * *